United States Patent
Hsieh

(10) Patent No.: US 10,504,828 B2
(45) Date of Patent: Dec. 10, 2019

(54) SEMICONDUCTOR PACKAGE AND CIRCUIT SUBSTRATE THEREOF

(71) Applicant: CHIPBOND TECHNOLOGY CORPORATION, Hsinchu (TW)

(72) Inventor: Chin-Tang Hsieh, Kaohsiung (TW)

(73) Assignee: CHIPBOND TECHNOLOGY CORPORATION, Hsinchu (TW)

( * ) Notice: Subject to any disclaimer, the term of this patent is extended or adjusted under 35 U.S.C. 154(b) by 0 days.

(21) Appl. No.: 15/990,747

(22) Filed: May 28, 2018

(65) Prior Publication Data

US 2019/0279926 A1    Sep. 12, 2019

(30) Foreign Application Priority Data

Mar. 12, 2018    (TW) .............................. 107108194 A

(51) Int. Cl.
  *H01L 23/498*    (2006.01)
  *H01L 23/31*    (2006.01)
  (Continued)

(52) U.S. Cl.
  CPC .... *H01L 23/49838* (2013.01); *H01L 23/3185* (2013.01); *H01L 24/16* (2013.01); *H01L 21/4846* (2013.01); *H01L 2224/16238* (2013.01)

(58) Field of Classification Search
  CPC ......... H01L 25/50; H01L 24/12; H01L 24/16; H01L 24/14; H01L 23/49811; H01L 2224/16238; H01L 23/49838
  See application file for complete search history.

(56) References Cited

U.S. PATENT DOCUMENTS

2007/0001280 A1* 1/2007 Hua .................... H01L 21/4846
                                                                      257/686
2009/0108443 A1* 4/2009 Jiang ....................... H01L 24/11
                                                                      257/737
(Continued)

FOREIGN PATENT DOCUMENTS

CN    107230665 A    10/2017
JP    2007-517405 A    6/2007
(Continued)

OTHER PUBLICATIONS

Taiwanese Office Action dated Aug. 22, 2018 for Taiwanese Patent Application No. 107108194, 12 pages.
(Continued)

*Primary Examiner* — Savitri Mulpuri
(74) *Attorney, Agent, or Firm* — Jackson IPG PLLC; Demian K. Jackson

(57) ABSTRACT

A semiconductor package includes a chip and a circuit substrate having leads. Each of the leads has an upper wide portion and a lower wide portion in a bonding area so as there are an upper notch and a lower notch in the bonding area. The upper and lower notches face toward the upper and lower wide portions of the adjacent lead, respectively. The upper and lower wide portions are designed to prevent defective bonding caused by shifting between the leads and the chip humps. Additionally, there are adequate etching spaces between the leads because the wide portions and the notches are staggered with each other such that incomplete etching between the leads is preventable during etching process.

11 Claims, 3 Drawing Sheets

(51) Int. Cl.
    *H01L 23/00*     (2006.01)
    *H01L 21/48*     (2006.01)

(56) References Cited

U.S. PATENT DOCUMENTS

2012/0098120 A1* 4/2012 Yu .......................... H01L 24/13
                                                                         257/737
2014/0077358 A1    3/2014 Chen et al.

FOREIGN PATENT DOCUMENTS

| | | |
|---|---|---|
| JP | 2007-220960 A | 8/2007 |
| JP | 2008-160026 A | 7/2008 |
| JP | 2010-283050 A | 12/2010 |
| JP | 2011-124484 A | 6/2011 |
| JP | 2012-028437 A | 2/2012 |
| JP | 2012-119361 A | 6/2012 |
| JP | 2012-174847 A | 9/2012 |
| JP | 2012-227546 A | 11/2012 |
| KR | 10-2017-0112866 A | 10/2017 |
| TW | 200711098 A | 3/2017 |

OTHER PUBLICATIONS

Korean Office Action dated Jun. 17, 2019 for Korean Patent Application No. 10-2018-0053038, 11 pages.
Japanese Office Action dated Jun. 26, 2019 for Japanese Patent Application No. 2018-090485, 3 pages.

\* cited by examiner

SEMICONDUCTOR PACKAGE AND CIRCUIT SUBSTRATE THEREOF

FIELD OF THE INVENTION

This invention relates to a semiconductor package, and more particularly relates to a semiconductor package provided to prevent insufficient bonding between chip and circuit substrate.

BACKGROUND OF THE INVENTION

In order to satisfy the requirement of consumer electronics, semiconductor devices gradually develop toward super fine pitch level. Reducing lead width and pitch can increase lead number for super fine pitch, however, defective bonding between leads on substrate and bumps on chip may occur easily because of shift between leads and bumps during thermal bonding process.

SUMMARY

An object of the present invention is to provide a circuit substrate. The circuit substrate includes a carrier, first and second leads. The first and second leads are formed on a surface of the carrier and aligned alternately along a transverse direction. Each of the first leads has a first upper wide portion, a first narrow portion, a first lower wide portion, an internal extending portion and a first lead section which are connected sequentially. The first upper wide portion, the first narrow portion, the first lower wide portion and the internal extending portion are located in a first bonding area for bonding a chip. Each of the second leads has an external extending portion, a second upper wide portion, a second narrow portion, a second lower wide portion and a second lead section which are connected sequentially. The external extending portion, the second upper wide portion, the second narrow portion and the second lower wide portion are located in a second bonding area for bonding the chip. Along the transverse direction, the first upper wide portion and the first lower wide portion are wider than the first narrow portion and the internal extending portion such that a first upper notch facing toward the second upper wide portion and a first lower notch facing toward the second lower wide portion are formed in the first bonding area of each of the first leads. And along the transverse direction, the second upper wide portion and the second lower wide portion are wider than the external extending portion and the second narrow portion such that a second upper notch facing toward the first upper wide portion and a second lower notch facing toward the first lower wide portion are formed in the second bonding area of each of the second leads.

Another object of the present invention is to provide a semiconductor package including a chip and a circuit substrate. The chip includes first and second bumps, and the circuit substrate includes a carrier, first and second leads. The first and second leads are formed on a surface of the carrier and aligned alternately along a transverse direction. Each of the first leads has a first upper wide portion, a first narrow portion, a first lower wide portion, an internal extending portion and a first lead section which are connected sequentially. The first upper wide portion, the first narrow portion, the first lower wide portion and the internal extending portion are located in a first bonding area and bonded with the first bump. Each of the second leads has an external extending portion, a second upper wide portion, a second narrow portion, a second lower wide portion and a second lead section which are connected sequentially. The external extending portion, the second upper wide portion, the second narrow portion and the second lower wide portion are located in a second bonding area and bonded with the second bump. Along the transverse direction, the first upper wide portion and the first lower wide portion are wider than the first narrow portion and the internal extending portion such that a first upper notch facing toward the second upper wide portion and a first lower notch facing toward the second lower wide portion are formed in the first bonding area of each of the first leads. And along the transverse direction, the second upper wide portion and the second lower wide portion are wider than the external extending portion and the second narrow portion such that a second upper notch facing toward the first upper wide portion and a second lower notch facing toward the first lower wide portion are formed in the second bonding area of each of the second leads.

When the leads are bonded with the bumps of the chip, the wide portions are provided to prevent the bonding failures caused by the detachment or shift between the leads and the bumps. In addition, because the wide portions and the notches are staggered with each other in the first and second bonding areas, there are adequate etching spaces between the leads and incomplete etching is preventable.

DETAILED DESCRIPTION OF THE INVENTION

Figure 1:
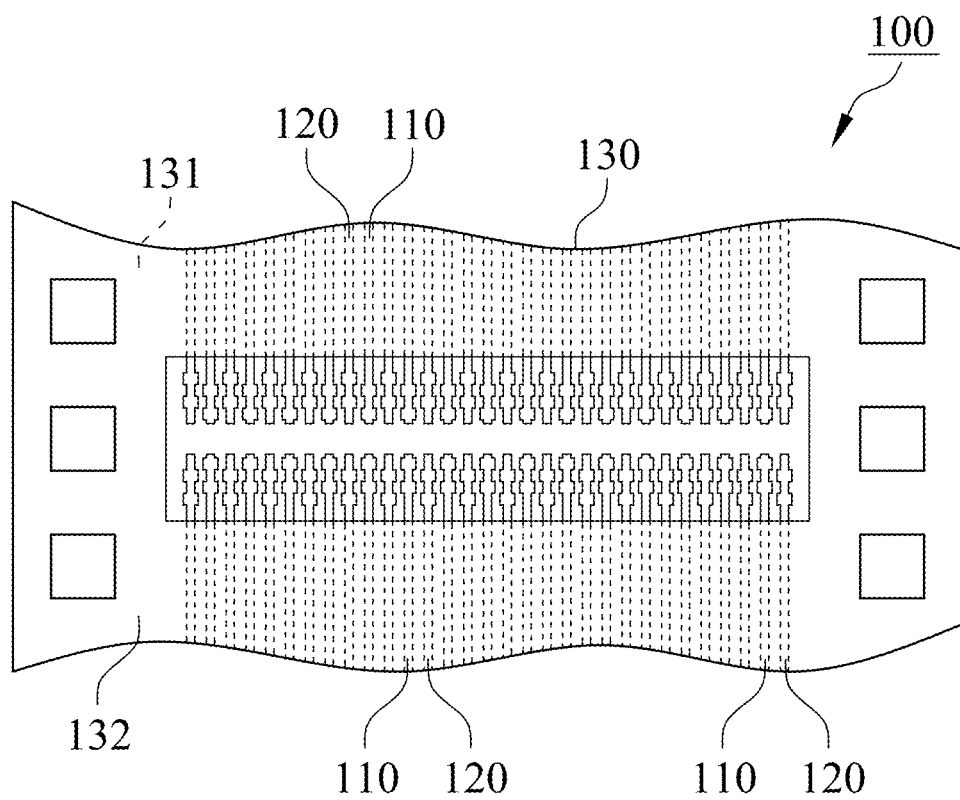
FIG. 1 is a top view diagram illustrating a circuit substrate in accordance with one embodiment of the present invention.
Figure 3:
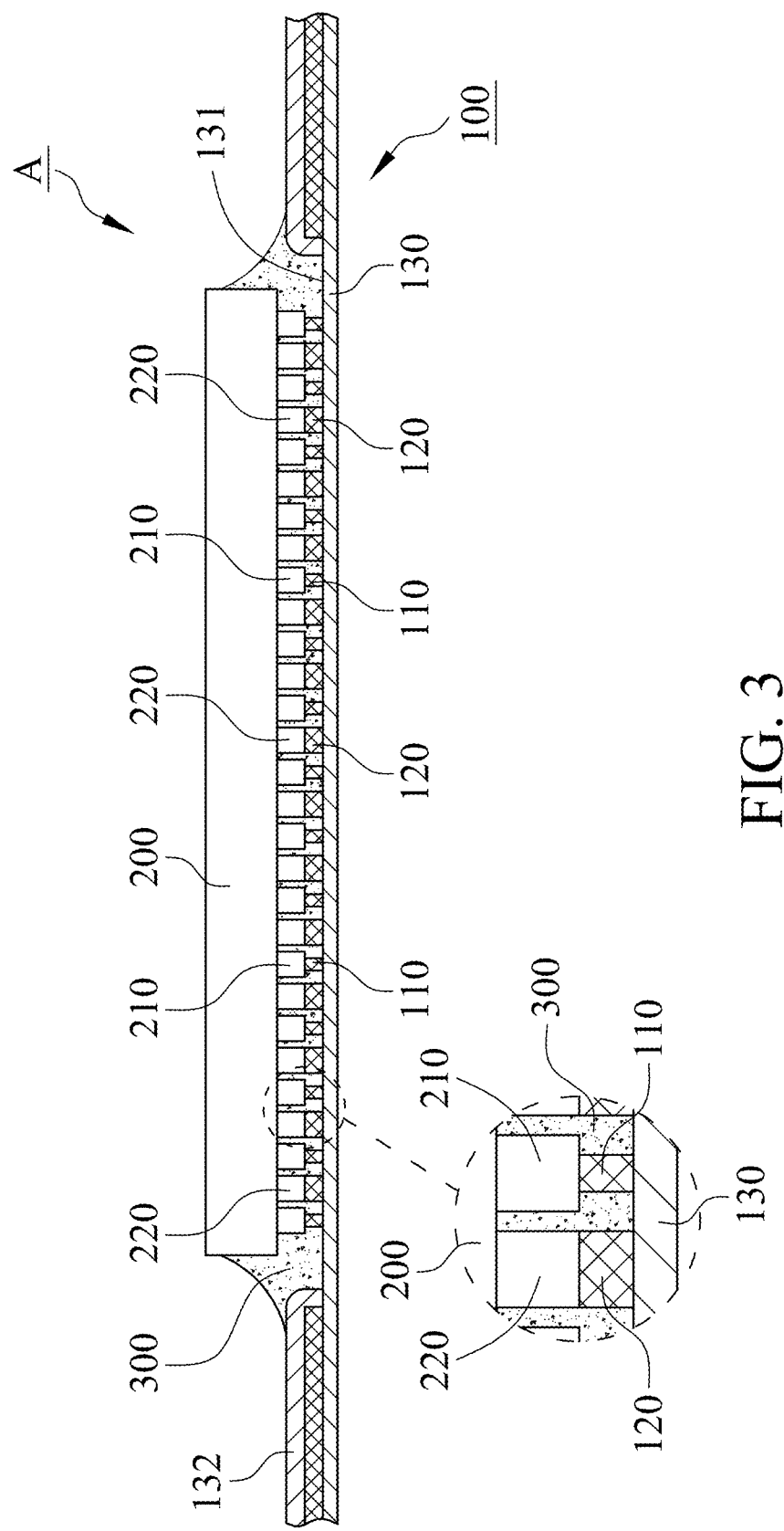
FIG. 3 is a lateral view diagram illustrating a semiconductor package in accordance with one embodiment of the present invention.

With reference to FIGS. 1 and 3, a semiconductor package A of the present invention includes a circuit substrate 100 and a chip 200. The circuit substrate 100 includes first leads 110, second leads 120 and a carrier 130. The first and second leads 110 and 120 are formed on a surface 131 of the carrier 130 and alternately aligned along a transverse direction. First bumps 210 and second bumps 220 are alternately aligned on the chip 200 along the transverse direction and bonded with the first leads 110 and the second leads 120, respectively. In this embodiment, the semiconductor package A further includes an encapsulant material 300 filled between the circuit substrate 100 and the chip 200. Preferably, the encapsulant material 300 is underfill.

Figure 2:
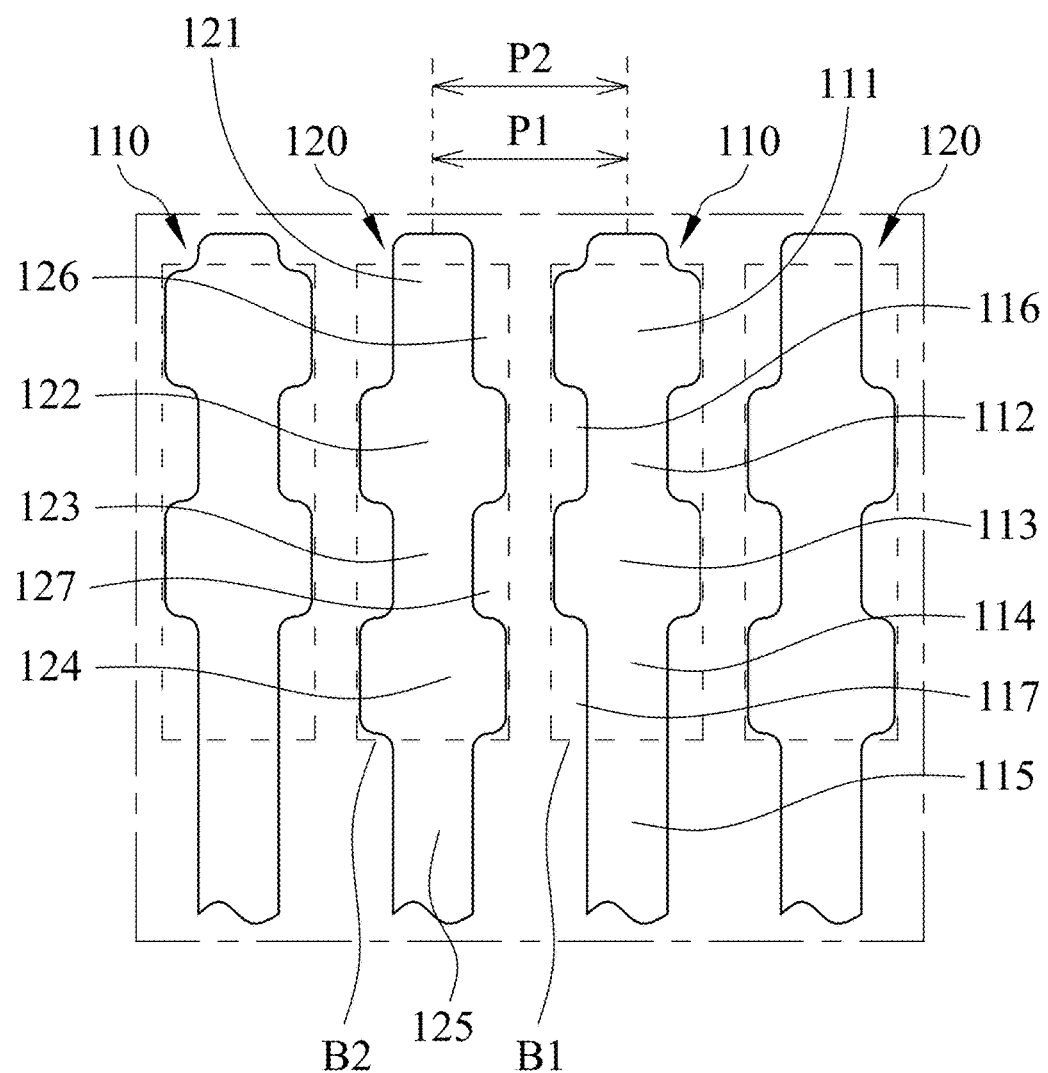
FIG. 2 is a partial top view diagram illustrating the circuit substrate in accordance with one embodiment of the present invention.

With reference to FIG. 2, each of the first leads 110 has a first upper wide portion 111, a first narrow portion 112, a first lower wide portion 113, an internal extending portion 114 and a first lead section 115 which are connected sequentially. A first bonding area B1 is defined on one end of each of the first leads 110, and the first upper wide portion 111, the first narrow portion 112, the first lower wide portion 113 and the internal extending portion 114 of each of the first leads 110 are located in the first bonding area B1 for bonding with each of the first bumps 210 of the chip 200.

With reference to FIG. 2, each of the second leads 120 has an external extending portion 121, a second upper wide portion 122, a second narrow portion 123, a second lower wide portion 124 and a second lead section 125 which are connected sequentially. A second bonding area B2 is defined on one end of each of the second leads 120, and the first and second bonding areas B1 and B2 are aligned along the transverse direction alternately. The external extending portion 121, the second upper wide portion 122, the second narrow portion 123 and the second lower wide portion 124 of each of the second leads 120 are located in the second bonding area B2 for bonding with each of the second bumps 220 of the chip 200. Preferably, the first and second bonding areas B1 and B2 are substantially flush with each other.

With reference to FIGS. 1 and 3, the carrier 130 includes a protection layer 132 forming on the surface 131. The protection layer 132 overlay the first lead section 115 of each of the first leads 110 and the second lead section 125 of each of the second leads 120, but not overlay the first and second bonding areas B1 and B2. As a result, the first leads 110 located in the first bonding areas B1 and the second leads 120 located in the second bonding areas B2 are visible on the carrier 130 for bonding the chip 200.

With reference to FIG. 2, in the transverse direction, the first upper wide portion 111 and the first lower wide portion 113 have substantially identical width, and the first narrow portion 112, the internal extending portion 114 and the first lead section 115 have substantially identical width. Furthermore, the first upper wide portion 111 and the first lower wide portion 113 are wider than the first narrow portion 112, the internal extending portion 114 and the first lead section 115, such that there are a first upper notch 116 and a first lower notch 117 formed in the first bonding area B1 of each of the first leads 110. In other words, the edges of the first upper wide portion 111 and the first lower wide portion 113 protrude from the edges of the first narrow portion 112 and the internal extending portion 114. The first upper notch 116 faces toward the second upper wide portion 122, and the first lower notch 117 faces toward the second lower wide portion 124. Preferably, the first upper wide portion 111 and the first lower wide portion 113 protrude from the first narrow portion 112 and the internal extending portion 114 about 0.5-3.5 µm along the transverse direction. The first upper wide portion 111 and the first lower wide portion 113 are designed to support the first bump 210 for preventing detachment or shifting between the first bump 210 and the first lead 110.

At least one side of the first upper wide portion 111 and the first lower wide portion 113 protrude from the first narrow portion 112 and the internal extending portion 114. With reference to FIG. 2, both sides of the first upper wide portion 111 and the first lower wide portion 113 protrude from the first narrow portion 112 and the internal portion 114 in this embodiment. The first narrow portion 112 and the internal extending portion 114 have a width between about 5 and 8 µm. In this embodiment, the first narrow portion 112 and the internal extending portion 114 have a width of about 7 µm, the first upper wide portion 111 and the first lower wide portion 113 have a width of about 9 µm and their both sides protrude from the first narrow portion 112 and the internal extending portion 114 about 1 µm, respectively.

With reference to FIG. 2, along the transverse direction, the second upper wide portion 122 and the second lower wide portion 124 have substantially identical width, and the external extending portion 121, the second narrow portion 123 and the second lead section 125 have substantially identical width. And the second upper wide portion 122 and the second lower wide portion 124 are wider than the external extending portion 121, the second narrow portion 123 and the second lead section 125. As a result, a second upper notch 126 facing toward the first upper wide portion 111 and a second lower notch 127 facing toward the first lower wide portion 113 are formed in the second bonding area B2 of each of the second leads 120. Preferably, the second upper wide portion 122 and the second lower wide portion 124 protrude from the external extending portion 121 and the second narrow portion 123 about 0.5-3.5 µm. The second upper wide portion 122 and the second lower wide portion 124 are provided to support the second bump 220 to prevent detachment or shifting between the second bump 220 and the second lead 120 when the chip 200 is bonded with the circuit substrate 100.

The second upper wide portion 122 and the second lower wide portion 124 are designed to protrude from the external extending portion 121 and the second narrow portion 123 on one or both sides. And preferably, the external extending portion 121 and the second narrow portion 123 have a width between about 5 and 8 µm. In this embodiment, both sides of the second upper wide portion 122 and the second lower wide portion 124 protrude from the external extending portion 121 and the second narrow portion 123. The width of the external extending portion 121 and the second narrow portion 123 is about 7 µm, and the width of the second upper wide portion 122 and the second lower wide portion 124 is about 9 µm, and both sides of the second upper wide portion 122 and the second lower wide portion 124 protrude from the external extending portion 121 and the second narrow 123 about 1 µm, respectively.

With reference to FIG. 3, the first bumps 210, the first upper wide portions 111 and the first lower wide portions 113 have substantially identical width in the transverse direction, and the second bumps 220, the second upper wide portions 122 and the second lower wide portions 124 have substantially identical width in the transverse direction, so can prevent the first and second leads 110 and 120 of the circuit substrate 100 from being damaged caused by shaking of the chip 200 in bonding process.

With reference to FIG. 2, a first pitch P1 defined between the first narrow portion 112 and the second upper wide portion 122 is the shortest distance of center-to-center, and a second pitch P2 defined between the second narrow portion 123 and the first lower wide portion 113 is the short distance of center-to-center. The first and second pitches P1 and P2 are substantially identical, and preferably, they are less than or equal to 20 µm. In this embodiment, the first and second pitches P1 and P2 are about 14 µm.

With reference to FIG. 3, the width of the first narrow portion 112 and the internal extending portion 114 are less than their thickness which is defined as the shortest distance between their top surface and the surface 131 of the carrier 130. Owing to the first narrow portion 112 and the internal extending portion 114 are designed to be spindly in shape, they may be distorted slightly when the first lead 110 is bonded with the first bump 210, so can prevent the first leads 110 from separating from the carrier 130 caused by bonding torque. Similarly, the external extending portion 121 and the second narrow portion 123 also have a width less than their thickness such that their spindly shape also may cause slightly distortion during bonding process to prevent the second leads 120 from separating from the carrier 130 because of bonding torque.

With reference to FIG. 3, the width of the first upper wide portion 111 and the first lower wide portion 113 preferably is not less than their thickness. The thickness of the first upper wide portion 111 and the first lower wide portion 113 is the shortest distance between their top surface and the surface 131 of the carrier 130. The first upper wide portion 111 and the first lower wide portion 113 can prevent the first leads 110 from breaking caused by over-distortion of the first narrow portion 112 and the internal extending portion 114 during bonding. In the same way, the second upper wide portion 122 and the second lower wide portion 124 have a width not less than their thickness and are provided to protect the second leads 120 from breaking.

In this embodiment, the thickness of the first and second leads 110 and 120 is about 8 μm, the width of the first upper wide portion 111, the first lower wide portion 113, the second upper wide portion 122 and the second lower wide portion 124 is about 9 μm, and the width of the first narrow portion 112, the internal extending portion 114, the external extending portion 121 and the second narrow portion 123 is about 7 μm.

When the chip 200 is bonded with the circuit substrate 100, the first upper wide portion 111 and the first lower wide portion 113 can reduce bonding failures result of shifting between the first leads 110 and the first bumps 210, and also, the second upper wide portion 122 and the second lower wide portion 124 can reduce bonding failures result of shifting between the second leads 120 and the second bumps 220. Otherwise, the first and second leads 110 and 120 of the present invention also can prevent the chip 200 from separating from the circuit substrate 100 due to the insufficient bonding strength of the first and second bumps 210 and 220.

A metal layer is etched to form the first and second leads 110 and 120 using a patterned photoresist as mask in pattern process. Owing to the wide portions and the notches of the first and second leads 110 and 120 are staggered mutually, there will be adequate etching spaces between the first and second leads 110 and 120 for preventing incomplete etching of leads.

While this invention has been particularly illustrated and described in detail with respect to the preferred embodiments thereof, it will be clearly understood by those skilled in the art that is not limited to the specific features shown and described and various modified and changed in form and details may be made without departing from the spirit and scope of this invention.

What is claimed is:

1. A circuit substrate comprising:
a carrier having a surface;
a plurality of first leads formed on the surface, wherein each of the first leads has a first upper wide portion, a first narrow portion, a first lower wide portion, an internal extending portion and a first lead section which are connected sequentially and wherein the first upper wide portion, the first narrow portion, the first lower wide portion, and the internal extending portion are located in a first bonding area for bonding a chip; and
a plurality of second leads formed on the surface, wherein the first and second leads are aligned alternately along a transverse direction, wherein each of the second leads has an external extending portion, a second upper wide portion, a second narrow portion, a second lower wide portion, and a second lead section which are connected sequentially and wherein the external extending portion, the second upper wide portion, the second narrow portion, and the second lower wide portion are located in a second bonding area for bonding the chip; wherein the first upper wide portion and the first lower wide portion are wider than the first narrow portion and the internal extending portion along the transverse direction such that a first upper notch facing toward the second upper wide portion and a first lower notch facing toward the second lower wide portion are formed in the first bonding area of each of the first leads; wherein the second upper wide portion and the second lower wide portion are wider than the external extending portion and the second narrow portion along the transverse direction such that a second upper notch facing toward the first upper wide portion and a second lower notch facing toward the first lower wide portion are formed in the second bonding area of each of the second leads; wherein the first and second bonding areas are aligned alternately along the transverse direction and flush with each other; wherein the first upper wide portion is located in an end of the first bonding area; wherein the external extending portion is located in an end of the second bonding area; and wherein the first upper wide portion and the external extending portion are flush with each other, wherein a first pitch is defined between the first narrow portion and the second upper wide portion, and a second pitch is defined between the second narrow portion and the first lower wide portion, wherein the first pitch is substantially equal to the second pitch, and wherein the first upper wide portion and the first lower wide portion have substantially identical width, and the first narrow portion and the internal extending portion have substantially identical width.

2. The circuit substrate in accordance with claim 1, wherein the first and second pitches are less than or equal to 20 μm.

3. The circuit substrate in accordance with claim 1, wherein an edge of the first upper wide portion protrudes from an edge of the first narrow portion approximately 0.5 to 3.5 μm.

4. The circuit substrate in accordance with claim 1, wherein the first upper wide portion has a width and a thickness, and the width is not less than the thickness.

5. The circuit substrate in accordance with claim 1, wherein the first narrow portion has a width and a thickness, and the width is less than the thickness.

6. A semiconductor package comprising:
a chip including a plurality of first bumps and a plurality of second bumps; and
a circuit substrate including a carrier, a plurality of first leads, and a plurality of second leads, the first and second leads are formed on a surface of the carrier and aligned alternately along a transverse direction, each of the first leads has a first upper wide portion, a first narrow portion, a first lower wide portion, an internal extending portion, and a first lead section which are connected sequentially, wherein the first upper wide portion, the first narrow portion, the first lower wide portion, and the internal extending portion are located in a first bonding area and bonded with the first bump, each of the second leads has an external extending portion, a second upper wide portion, a second narrow portion, a second lower wide portion, and a second lead section which are connected sequentially, wherein the external extending portion, the second upper wide portion, the second narrow portion, and the second lower wide portion are located in a second bonding area and bonded with the second bump;
wherein the first upper wide portion and the first lower wide portion are wider than the first narrow portion and the internal extending portion along the transverse direction such that a first upper notch facing toward the second upper wide portion and a first lower notch facing toward the second lower wide portion are formed in the first bonding area of each of the first leads;
wherein the second upper wide portion and the second lower wide portion are wider than the external extending portion and the second narrow portion along the transverse direction such that a second upper notch facing toward the first upper wide portion and a second lower notch facing toward the first lower wide portion are formed in the second bonding area of each of the second leads; wherein the first and second bonding areas are aligned alternately along the transverse direction and flush with each other; wherein the first upper wide portion is located on an end of the first bonding area; wherein the external extending portion is located on an end of the second bonding area; and wherein the first upper wide portion and the external extending portion are flush with each other, wherein a first pitch is defined between the first narrow portion and the second upper wide portion, and a second pitch is defined between the second narrow portion and the first lower wide portion, wherein the first pitch is substantially equal to the second pitch, and wherein the first upper wide portion and the first lower wide portion have substantially identical width, and the first narrow portion and the internal extending portion have substantially identical width.

7. The semiconductor package in accordance with claim 6, wherein the first and second pitches are less than or equal to 20 µm.

8. The semiconductor package in accordance with claim 6, wherein an edge of the first upper wide portion protrudes from an edge of the first narrow portion approximately 0.5 to 3.5 µm.

9. The semiconductor package in accordance with claim 6, wherein the first upper wide portion has a width and a thickness, and the width is not less than the thickness.

10. The semiconductor package in accordance with claim 6, wherein the first narrow portion has a width and a thickness, and the width is less than the thickness.

11. The semiconductor package in accordance with claim 6, wherein the first bumps, the first upper wide portions and the first lower wide portions have substantially identical width.

* * * * *